United States Patent [19]

Burmeister et al.

[11] Patent Number: 4,765,710
[45] Date of Patent: Aug. 23, 1988

[54] DISTRIBUTING FRAME FOR OPTICAL WAVEGUIDES AND THE LIKE

[75] Inventors: Klaus-Dieter Burmeister; Erhard Holbe, both of Munich; Werner Schreiner, Hoehenkirchen, all of Fed. Rep. of Germany

[73] Assignee: Siemens Aktiengesellschaft, Berlin and Munich, Fed. Rep. of Germany

[21] Appl. No.: 874,902

[22] Filed: Jun. 16, 1986

[30] Foreign Application Priority Data

Jul. 30, 1985 [DE] Fed. Rep. of Germany ....... 3527278

[51] Int. Cl.⁴ .......................... G02B 6/00; G02B 6/36
[52] U.S. Cl. ............................. 350/96.20; 350/96.10
[58] Field of Search .............. 350/96.10, 96.20, 96.21, 350/96.22, 96.23

[56] References Cited

U.S. PATENT DOCUMENTS

| | | | |
|---|---|---|---|
| 4,266,853 | 5/1981 | Hutchins et al. | 350/96.20 |
| 4,585,303 | 4/1986 | Pinsard et al. | 350/96.21 X |
| 4,630,886 | 12/1986 | Lauriello et al. | 350/96.20 |

FOREIGN PATENT DOCUMENTS 6913011 3/1969 Fed. Rep. of Germany .

Primary Examiner—William L. Sikes
Assistant Examiner—Akm E. Ullah
Attorney, Agent, or Firm—Mark H. Jay

[57] ABSTRACT

A distributing frame for optical waveguides. The distributing frame is provided with connector blocks for receiving components designed to connect optical waveguides. The connector blocks are layered upon one another in panels and are mounted on a framework such that they may be individually moved in the layer plane. In a preferred embodiment each connector block is secured to a rod which can be swivelled in the layer plane.

12 Claims, 2 Drawing Sheets

DISTRIBUTING FRAME FOR OPTICAL WAVEGUIDES AND THE LIKE

BACKGROUND OF THE INVENTION

The invention relates to a distributing frame for optical waveguides and the like. It relates in particular to a distributing frame for fiber optic cables, having connecting blocks aligned in a panel.

In distributing frame for telephone exchanges, a layered structure of distributing components is common. An example of such a structure is disclosed in the German Patent document "Gebrauchsmuster" No. 69 13 011. There the lines are led from the rear to connecting elements at the front of the main distributing frame. The establishment and alteration of connections can therefore be carried out without hindrance in each individual connecting element.

For optical waveguides, plug connectors, which can be arranged in appropriate connector blocks of the distributing frame, are essentially used as connector components. When bent too tightly the optical waveguides are liable to damage, so that it is advisable to lead them from the framework side to the connector components in a line which is as straight as possible. Plugging at the front of the connector blocks is therefore rendered considerably difficult.

It is an object of the invention to provide a distributing frame for optical waveguides which has readily accessible connector components.

It is another object of the invention to provide a distributing frame for optical waveguides which exposes the optical waveguides only to a minimum danger of breakage.

Yet another object of the invention is to improve on distributing frames of the art.

SUMMARY OF THE INVENTION

Broadly, the invention is directed to a distributing frame for optical waveguides or the like which comprises a fixed framework, a plurality of like hollow connector blocks and means for securing each connector block to the framework. The connector blocks are secured such that all connector blocks are movable to a position in which they are aligned in a panel and that each connector block is independently movable in a plane perpendicular to a longitudinal axis of the panel.

Such a structure allows a particular connector block to be moved from the panel (or the panel to be moved from a connector block) to such an extent that the connector block is open and the connector components, which are fixed therein, are readily accessible. Thus, it is possible to lead the optical waveguides from the rear of the connector blocks to the latter without considerable bending.

According to a more specific aspect of the invention, each connector block is pivotably mounted on the framework. This design helps to individually move a connector block from a panel without considerably bending the optical waveguides. By swinging entire panels of connector blocks out of the way the wiring space behind them is more easily accessible, so that alternations to the run of the optical waveguide, e.g. during shunting, can be more easily carried out.

According to a further aspect of the invention the securing means comprise a first retaining rod which is pivotably mounted on the framework. In this case, the connector block is then pivoted around an axle, spaced from this axle so that the radii of curvature of the optical waveguides do not considerably change during swivelling.

According to another aspect of the invention, each connector block has a rectangular basal plane with two broad and two narrow sides and the first retaining rod forms an extension of one of the two narrow sides. In such an arrangement the optical waveguides can be led to the rear of the connector block to the latter without any hindrance. If each connector block is secured also to a second retaining rod pivotably mounted on the framework and forming an extension of the other of the two narrow sides and if the connector block is pivotally secured to both rods with all four pivot axis being parallel to each other, the connector block may laterally swivel without changing its angular position. In addition, the positioning of the connector blocks becomes considerably more stable.

In one embodiment of the invention each connector block can be swivelled in both directions from its normal position. Thus, two adjacent panels of connector blocks may be swivelled apart in the opposite direction, so that the accessibility of the wiring space behind these panels is even more improved.

In another embodiment of the invention the framework has a front plane and each connector block can be moved along the direction perpendicular to this plane. This allows the individual connector blocks to be secured to the framework at a narrow panel distance. The individual connector blocks may be withdrawn from the panel to such an extent that the connector components are easily accessible. To accommodate for withdrawing the connector blocks, i.e., to provide a line reserve, the waveguide should have a loop arranged directly behind its connector block.

In a still further embodiment of the invention each connector block is slidably mounted in a rail-like guide element which may be part of a U-shaped guide clip mounted on the framework. This allows a particularly good guidance of the connector blocks, which may be withdrawn to a particularly large extent and beyond the panel space, if they are mounted in a telescopic guide.

The foregoing and other objects, features an advantageous of the invention will be apparent from the following particular description of preferred embodiments of the invention which are illustrated in the accompanying drawing.

DETAILED DESCRIPTION

Figure 1:
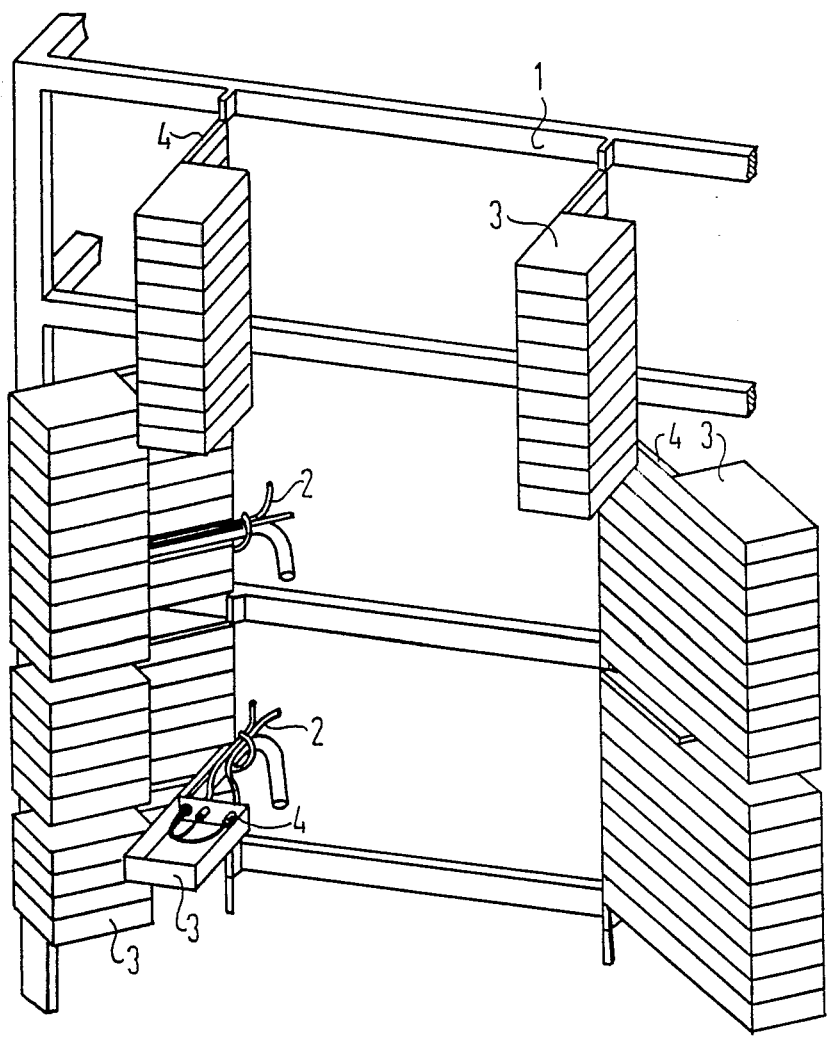
FIG. 1 is a perspective view of a first embodiment of the invention.

FIG. 1 shows a framework 1 of a distributing frame for optical waveguides 2. Connector blocks 3 which are layered on top of one another are pivotably mounted on two swivel axis which are secured to framework 1. Connector blocks 3 accommodate connector components 4 for connecting the optical waveguides 2. The perspective view illustrates two upper panels of connector blocks 3 in their normal position at right angles to the framework plane. Two lower panels of connector blocks 3 are swivelled towards the righthand side and the lefthand side, respectively, so that the wiring space behind the connector blocks 3 is readily accessible. Here one of the connector blocks 3 remain in its normal position and protrudes from the panel of the remaining connector blocks 3, so that its connector components 4 are accessible. The optical waveguides 2 are lead from the rear to the connector blocks 3. Each connector block 3 is retained at a distance from framework 1 by means of a retaining rod 4'. Rod 4' is laterally led to the connector block 3, so that the rear of the connector block provides sufficient space for installing the optical waveguides 2. Because of the retaining rods 4' the optical waveguides 2 are only negligibly bent when the connector blocks 3 are swivelled away. The retaining rods 4' have their free end pivotably mounted on framework 1. Thus, the point of rotation is spaced from the connector blocks 3 to such an extent that they can be easily swivelled from the panel.

Figure 2:
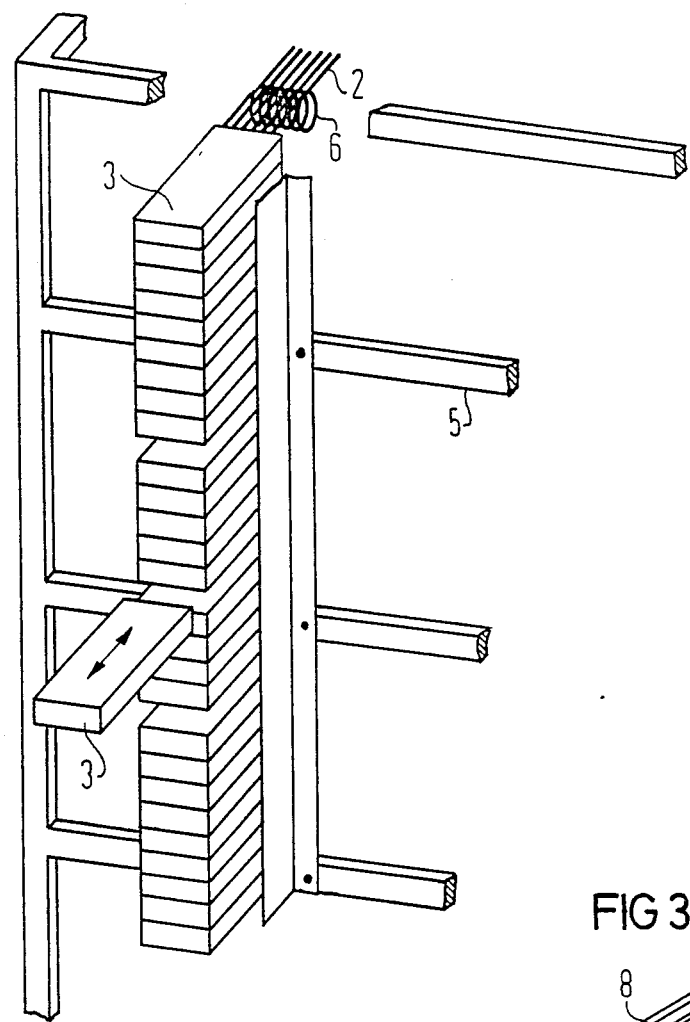
FIG. 2 illustrates a perspective view of another embodiment of the invention.

The embodiment shown in FIG. 2 is provided with another framework 5. The connector blocks 3 are mounted on this framework so as to be displaceable at right angles to the front plane of framework 5 as indicated by an arrow on the withdrawn connector block.

On the rear of the connector blocks 3 each optical waveguide 2 runs through a loop 6 which represents a length reserve for drawing the connector blocks 3.

Each connector block 3 can be withdrawn from the remaining connector blocks 3, which are layered upon one another to form panels, by appropriate guide means towards the front to such an extent that the connector components, e.g. plug connectors which are retained therein, are freely accessible.

Figure 3:
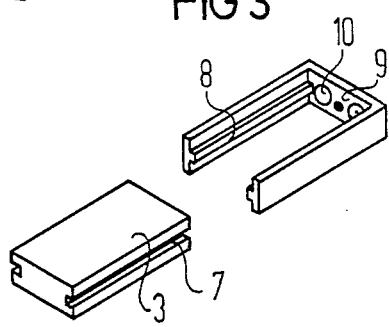
FIG. 3 illustrates, in an exploded view, from the embodiment of FIG. 2, a connector block and its corresponding guide.

As shown in FIG. 3, each connector block 3 is provided with guide grooves 7 on both sides, into which grooves corresponding rail-like guide elements 8 of a U-shaped guide clip 9 can engage. The base of the guide clip 9 is provided with through bores 10 for the penetration of the optical waveguides.

Having thus described the invention with particular reference to the preferred forms thereof, it will be obvious to those skilled in the art to which the invention pertains, after understanding the invention, that various changes and modifications may be made therein without departing from the spirit and scope of the invention as defined by the claims appended hereto.

We claim:

1. A distributing frame for optical waveguides and the like, comprising:
   (a) a fixed framework;
   (b) a plurality of like hollow connector blocks for receiving waveguide connectors; and
   (c) securing means for movably securing each connector block to the framework in a manner that
      all the connector blocks are movable to a first position in which they are aligned on top of each other along a longitudinal axis, thereby forming a panel and
      each of the connector blocks is independently movable in a plane which is perpendicular to said longitudinal axis.

2. A distributor according to claim 1, wherein each connector block is pivotably secured to the framework.

3. A distributor according to claim 2, wherein the securing means include a first retaining rod which is pivotably mounted on the framework.

4. A distributor according to claim 3, wherein each connector block has a rectangular basal plane with two broad and two narrow sides and wherein the first retaining rod forms an extension of one of the two narrow sides.

5. A distributor according to claim 4, wherein the securing means further includes a second retaining rod which is pivotably mounted on the framework and forms an extension of the other of the two narrow sides, and wherein the connector block is pivotably secured to both retaining rods, with all four pivot axes being parallel to each other.

6. A distributor according to claim 2, wherein each connector block can be pivoted in both directions from its first position.

7. A distributor according to claim 1, wherein the framework has a front plane and each connector block is movable along a direction perpendicularly to said plane.

8. A distributor according to claim 7, further comprising optical waveguides, each being led into one of the connector blocks and having a loop adjacent to the respective connector block.

9. A distributor according to claim 7, wherein the securing means include a rail-like guide element in which the connector block is slidably mounted.

10. A distributor according to claim 9, wherein the guide element is part of a U-shaped guide clip which is mounted on the framework.

11. A distributor according to claim 7, wherein the securing means include a telescopic guide in which the connector block is mounted.

12. A distributor according to claim 1, wherein the connector blocks are grouped in a number of individually movable panels.

* * * * *